(12) United States Patent
Hintze et al.

(10) Patent No.: US 9,177,826 B2
(45) Date of Patent: Nov. 3, 2015

(54) METHODS OF FORMING METAL NITRIDE MATERIALS

(75) Inventors: Bernd Hintze, Langebrueck (DE);
Frank Koschinsky, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/364,671

(22) Filed: Feb. 2, 2012

(65) Prior Publication Data

US 2013/0203266 A1    Aug. 8, 2013

(51) Int. Cl.
| | |
|---|---|
| *H01L 21/32* | (2006.01) |
| *H01L 21/321* | (2006.01) |
| *H01L 21/3205* | (2006.01) |
| *H01L 21/768* | (2006.01) |

(52) U.S. Cl.
CPC ........ *H01L 21/321* (2013.01); *H01L 21/32051* (2013.01); *H01L 21/76861* (2013.01); *H01L 21/76864* (2013.01)

(58) Field of Classification Search
CPC ................................................. H01L 21/32051
USPC .......................................................... 438/763
See application file for complete search history.

(56) References Cited

U.S. PATENT DOCUMENTS

| | | | | | |
|---|---|---|---|---|---|
| 5,070,036 | A | * | 12/1991 | Stevens | 438/627 |
| 5,895,266 | A | | 4/1999 | Fu et al. | |
| 5,960,320 | A | * | 9/1999 | Park | 438/688 |
| 5,972,178 | A | | 10/1999 | Narasimhan et al. | |
| 6,110,789 | A | * | 8/2000 | Rhodes et al. | 438/305 |
| 6,255,204 | B1 | * | 7/2001 | Tobin et al. | 438/592 |
| 6,410,420 | B2 | * | 6/2002 | Akram et al. | 438/630 |
| 6,551,947 | B1 | * | 4/2003 | Ono et al. | 438/770 |
| 6,661,096 | B1 | * | 12/2003 | Takayama et al. | 257/763 |
| 6,670,267 | B2 | | 12/2003 | Fortin | |
| 6,727,172 | B1 | * | 4/2004 | Jong et al. | 438/626 |
| 6,730,955 | B2 | * | 5/2004 | Shinohara et al. | 257/306 |
| 6,998,337 | B1 | * | 2/2006 | Tran | 438/618 |
| 2002/0064598 | A1 | * | 5/2002 | Wang et al. | 427/255.391 |
| 2002/0102802 | A1 | * | 8/2002 | Tan et al. | 438/305 |
| 2002/0155219 | A1 | | 10/2002 | Wang et al. | |
| 2002/0175413 | A1 | * | 11/2002 | Lanzerotti et al. | 257/751 |
| 2003/0003721 | A1 | * | 1/2003 | Fortin | 438/653 |
| 2003/0032224 | A1 | * | 2/2003 | Sung et al. | 438/197 |
| 2003/0049890 | A1 | * | 3/2003 | Liao et al. | 438/123 |
| 2003/0072884 | A1 | * | 4/2003 | Zhang et al. | 427/255.391 |
| 2003/0183308 | A1 | * | 10/2003 | Yang et al. | 148/518 |
| 2005/0051854 | A1 | * | 3/2005 | Cabral et al. | 257/407 |

(Continued)

OTHER PUBLICATIONS

Okudaira et al., "Investigation of the Divided Deposition Method of TiN Thin Films for Metal-Insulator-Metal Capacitor Applications," Japanese Journal of Applied Physics, 44:7765-69, 2005.

*Primary Examiner* — Yu-Hsi D Sun
*Assistant Examiner* — Ankush Singal
(74) *Attorney, Agent, or Firm* — Amerson Law Firm, PLLC

(57) ABSTRACT

Disclosed herein are various methods of forming metal nitride layers on various types of semiconductor devices. In one example, the method includes forming a layer of insulating material above a semiconducting substrate, performing a physical vapor deposition process to form a metal nitride layer above the layer of insulating material, wherein the metal nitride layer has an intrinsic as-deposited stress level, and performing at least one process operation on the metal nitride layer to reduce a magnitude of the intrinsic as-deposited stress level in the metal nitride layer.

28 Claims, 4 Drawing Sheets

(56) References Cited

U.S. PATENT DOCUMENTS

| | | | |
|---|---|---|---|
| 2005/0112876 A1* | 5/2005 | Wu et al. | 438/685 |
| 2005/0269703 A1* | 12/2005 | Dunn et al. | 257/751 |
| 2006/0003182 A1* | 1/2006 | Lane et al. | 428/688 |
| 2006/0014385 A1* | 1/2006 | Kim et al. | 438/680 |
| 2006/0128108 A1* | 6/2006 | Kim et al. | 438/381 |
| 2006/0240679 A1* | 10/2006 | Lee et al. | 438/785 |
| 2006/0273426 A1* | 12/2006 | Iijima | 257/532 |
| 2008/0061399 A1* | 3/2008 | Abe | 257/532 |
| 2008/0081430 A1* | 4/2008 | Park et al. | 438/393 |
| 2008/0081480 A1* | 4/2008 | Frohberg et al. | 438/703 |
| 2008/0099148 A1* | 5/2008 | Ryabova et al. | 156/345.48 |
| 2008/0142971 A1* | 6/2008 | Dordi et al. | 257/751 |
| 2008/0242035 A1* | 10/2008 | Futase et al. | 438/296 |
| 2008/0274616 A1 | 11/2008 | Hasegawa | |
| 2008/0274624 A1 | 11/2008 | Hasegawa | |
| 2009/0212389 A1* | 8/2009 | Cheol | 257/529 |
| 2009/0227105 A1* | 9/2009 | Fu et al. | 438/653 |
| 2010/0038789 A1* | 2/2010 | Cheng et al. | 257/753 |
| 2010/0311219 A1* | 12/2010 | Bhat et al. | 438/396 |
| 2011/0124175 A1 | 5/2011 | Sugawara et al. | |
| 2011/0169132 A1* | 7/2011 | Yamamoto et al. | 257/532 |
| 2012/0034749 A1* | 2/2012 | Lim et al. | 438/303 |
| 2012/0034753 A1* | 2/2012 | Bhat et al. | 438/396 |
| 2012/0132966 A1* | 5/2012 | Doris et al. | 257/288 |

* cited by examiner

METHODS OF FORMING METAL NITRIDE MATERIALS

BACKGROUND OF THE INVENTION

1. Field of the Invention

Generally, the present disclosure relates to the manufacturing of sophisticated semiconductor devices, and, more specifically, to various methods of forming metal nitride layers on various types of semiconductor devices.

2. Description of the Related Art

In manufacturing semiconductor devices, it is very common to use metal nitride films or layers for a variety of purposes. For example, titanium nitride has been employed as a hard mask material that is formed above one or more layers of insulating material on an integrated circuit product. Metal nitride layers have also been employed in other applications, such as for capacitor electrodes, contacts, barrier liners, etc. Metal nitride layers may be formed by performing a chemical-based process, like a chemical vapor deposition (CVD) process using appropriate precursors, or by performing a sputtering type process, such as a physical vapor deposition (PVD) process in which material is sputtered off of an appropriate metal target. Plasma-enhanced versions of such processes may also be employed to form metal nitride layers. Illustrative examples of metal nitride layers include titanium nitride, tantalum nitride, zirconium nitride, hafnium nitride, etc.

Typically, a metal nitride layer, such as a layer of titanium nitride—in the "as formed" condition—has a relatively high intrinsic stress level, such as a relatively high compressive stress level. In general, it is desirable that the intrinsic stress level of the metal nitride layer be as low as possible so as not to transfer this intrinsic stress level in the metal nitride layer to adjacent dielectric layers, such as so-called "low-k" dielectric materials (k value less than 3), that are not as strong mechanically as the metal nitride layer. There are only a few known methods for reducing the intrinsic stress level in a metal nitride layer, such as a layer of titanium nitride. However, such methods typically result in a reduction of the density of the metal nitride layer, which may adversely impact other processing operations that are to be performed on the metal nitride layer. More specifically, reducing the density of a metal nitride layer may have the effect of reducing the etch selectivity exhibited by the metal nitride layer when it is exposed to at least some etching processes. The reduction in the density of a metal nitride layer, therefore, may require more complex and perhaps less efficient etching processes.

One technique employed in an attempt to reduce the intrinsic stress of a metal nitride layer, such as an illustrative layer of titanium nitride, involves performing a relatively high-temperature anneal process (T>750° C.) in atmospheres of hydrogen ($H_2$), nitrogen ($N_2$), or combinations thereof, as well as ammonium ($NH_3$), that may reduce the intrinsic stress level in a metal nitride layer to some degree. However, such high-temperature anneals cannot be employed on integrated circuit products where copper-based metallization systems are employed.

Depending upon the allowable "thermal budget" for the particular device under construction, certain deposition techniques have been employed to form metal nitride layers with different stress conditions. For example, titanium nitride layers that are formed using a $TiCl_4$-based CVD process tend to exhibit a tensile intrinsic stress level as originally deposited, while titanium nitride layers that are formed using a $TiCl_4$-based PECVD process tend to exhibit an intrinsic compressive stress. The intrinsic stress levels in such CVD deposited layers of titanium nitride can be modified, to at least some degree, by modifying nitridation cycle numbers and/or processing time. Additionally, titanium nitride layers that are formed using a $TiCl_4$-based atomic layer deposition (ALD) process tend to exhibit a tensile intrinsic stress level as originally deposited, while titanium nitride layers that are formed using a $TiCl_4$-based PEALD process tend to exhibit an intrinsic compressive stress. From a thermal budget point of view, CVD formation of titanium nitride layers typically involves relatively high temperatures (>600° C.) although there are some CVD processes that may be performed at temperatures of down to about 350° C. (divided cycle or pulsed CVD processes). Titanium nitride layers formed using an ALD process may be formed at relatively lower temperatures (<400° C.).

Titanium nitride layers that exhibit a tensile intrinsic stress may also be formed using a metal-organic chemical vapor deposition (MOCVD) process using TDMAT (tetrakis dimethyl-amino titanium) and TEMAT (tetrakis diethyl-amino titanium) as precursors. However, the resulting titanium nitride layers with no plasma densification are not as dense as titanium nitride layers formed by other processes, and therefore tend to oxidize more easily as compared to more dense titanium nitride layers.

Despite the various techniques employed to form metal nitride layers, such as the illustrative ones briefly described above, and various attempts to reduce the intrinsic stress levels of the resulting metal nitride layers, there still is a need for an effective and efficient technique for reducing the intrinsic stress levels for metal nitride layers. Thus, the present disclosure is directed to various, more efficient methods of forming metal nitride layers on various types of semiconductor devices that may at least reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming metal nitride layers on various types of semiconductor devices. In one example, the method includes forming a layer of insulating material above a semiconducting substrate, performing a physical vapor deposition process to form a metal nitride layer above the layer of insulating material, wherein the metal nitride layer has an intrinsic as-deposited stress level, and performing at least one process operation on the metal nitride layer to reduce a magnitude of the intrinsic as-deposited stress level in the metal nitride layer.

In another example, the method includes forming a layer of insulating material above a semiconducting substrate, performing a physical vapor deposition process to form a layer of titanium nitride above the layer of insulating material, wherein the layer of titanium nitride has an intrinsic as-deposited stress level, and performing at least one process operation on the layer of titanium nitride to reduce a magnitude of the intrinsic as-deposited stress level in the layer of titanium nitride.

In another illustrative example, a method disclosed herein involves performing a chemical vapor deposition process to form a TEOS-based layer of silicon dioxide above a semiconducting substrate, performing a physical vapor deposition process to form a layer of titanium nitride above the TEOS-based layer of silicon dioxide, wherein the layer of titanium nitride has an intrinsic as-deposited stress level, and performing an anneal process on the layer of titanium nitride in the presence of a forming gas to reduce a magnitude of the intrinsic as-deposited stress level in the layer of titanium nitride.

In yet another illustrative example, a method disclosed herein includes performing a chemical vapor deposition process to form a TEOS-based layer of silicon dioxide above a semiconducting substrate, performing a physical vapor deposition process to form a layer of titanium nitride above the TEOS-based layer of silicon dioxide, wherein the layer of titanium nitride has an intrinsic as-deposited stress level, and performing an anneal process on the layer of titanium nitride in the presence of hydrogen to reduce a magnitude of the intrinsic as-deposited stress level in the layer of titanium nitride.

Yet another illustrative method disclosed herein involves the steps of performing a chemical vapor deposition process to form a TEOS-based layer of silicon dioxide above a semiconducting substrate, performing a physical vapor deposition process to form a layer of titanium nitride above the TEOS-based layer of silicon dioxide, wherein the layer of titanium nitride has an intrinsic as-deposited stress level, and performing a remote plasma process on the layer of titanium nitride to reduce a magnitude of the intrinsic as-deposited stress level in the layer of titanium nitride.

BRIEF DESCRIPTION OF THE DRAWINGS

The disclosure may be understood by reference to the following description taken in conjunction with the accompanying drawings, in which like reference numerals identify like elements, and in which.

Figure 1:
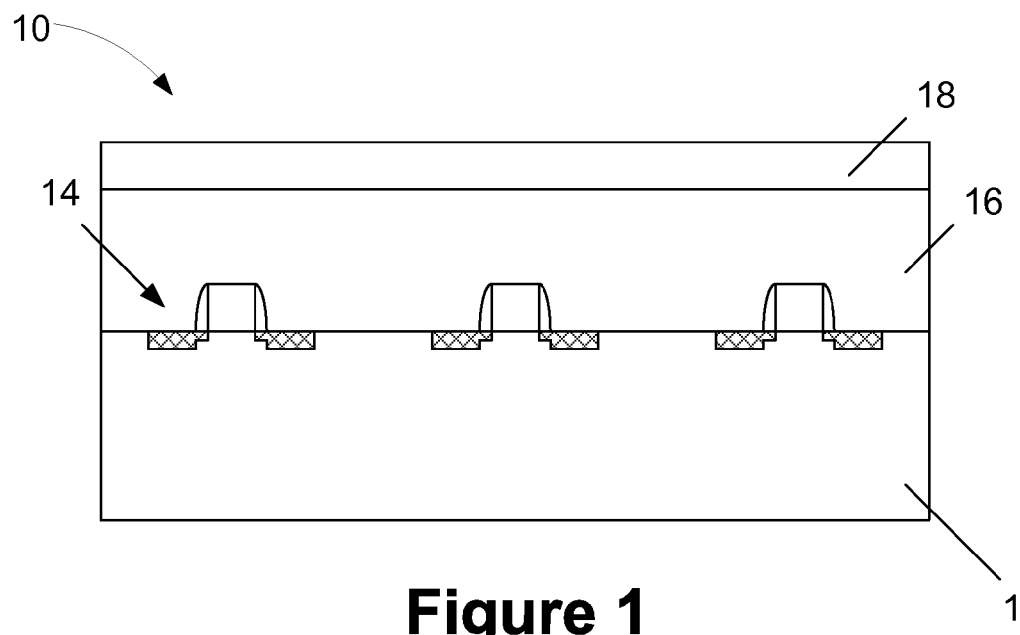
FIG. 1 is a depiction of an illustrative metal nitride layer formed above a layer of insulating material.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming metal nitride layers on various types of semiconductor devices. As will be readily apparent to those skilled in the art upon a complete reading of the present application, the methods disclosed herein may be applicable to forming metal nitride layers on a variety of integrated circuit products including, but not limited to, ASICs, logic devices, memory devices, etc. With reference to the attached drawings, various illustrative embodiments of the methods and devices disclosed herein will now be described in more detail.

FIG. 1 is a simplified view of an illustrative integrated circuit product 10 at an early stage of manufacturing that is formed above a semiconducting substrate 12. The integrated circuit product 10 is intended to be representative in nature as it may be any type of product that is comprised of semiconductor devices, such as transistors, memory arrays, etc. The substrate 12 may have a variety of configurations, such as the depicted bulk silicon configuration. The substrate 12 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 12 may also be made of materials other than silicon. Also depicted in FIG. 1 is a plurality of illustrative semiconductor devices 14, e.g., simplistically depicted transistors, that are formed in and above the substrate 12. Of course, many aspects of a real-world transistor are not depicted in FIG. 1 so as not to obscure the inventions disclosed herein.

With continuing reference to FIG. 1, an illustrative layer of insulating material 16 and a metal nitride layer 18 are formed above the substrate 12. As will be recognized by those skilled in the art after a complete reading of the present application, the layer of insulating material 16 may be comprised of a variety of different materials and it may be formed at any level of the integrated circuit product 10. For example, the layer of insulating material 16 may be comprised of a so-called ultra-low-k (k value less than 2.8) material, a low-k (k value less than 3) insulating material, a TEOS-based silicon dioxide, etc., and its thickness may vary depending upon the particular application. The layer of insulating material 16 may be formed by performing any of a variety of known processing techniques, e.g., CVD, ALD, etc., or plasma-enhanced versions of such processes. In one illustrative embodiment, the layer of insulating material 16 may be a dense silicon dioxide material such as a TEOS-based (Tetraethyl orthosilicate) layer of silicon dioxide having a thickness of about 100-400 nm, and in one particular embodiment, about 350 nm, that is formed by a CVD process. In one illustrative embodiment, such a TEOS-based layer of silicon dioxide may have a density of about 2.20 g/cm$^3$.

Similarly, after a complete reading of the present application, those skilled in the art will recognize that the metal nitride layer 18 may be comprised of a variety of different materials and it may be formed at any level of the integrated circuit product 10. For example, the metal nitride layer 18 may be comprised of titanium nitride, tantalum nitride, niobium nitride, tungsten nitride, vanadium nitride, zirconium nitride, hafnium nitride, yttrium nitride, molybdenum nitride, etc., and its thickness may vary depending upon the particular application. The metal nitride layer 18 may be formed by performing any of a variety of known processing techniques, e.g., CVD, ALD, etc., or plasma-enhanced versions of such processes. In one illustrative embodiment, the metal nitride layer 18 may be a titanium nitride layer having a thickness of about 15-20 nm, that may be formed by performing a physical vapor deposition (PVD) process at a temperature of about 300° C. using a titanium target in a nitrogen/argon plasma. In some applications, a dopant material may be introduced into the metal nitride layer 18, e.g., a dopant material such as aluminum (Al), boron (B), carbon (C), silicon (Si), hafnium (Hf), zirconium (Zr), vanadium (V), niobium (Nb), yttrium (Y), etc. The dopant material may be introduced into the metal nitride layer 18 by way of ion implantation or by doping the target used in the PVD process that is performed to form the metal nitride layer 18.

As originally formed, the metal nitride layer 18 has an "as-deposited" or intrinsic stress level. The intrinsic stress level in the metal nitride layer 18 may be either a compressive stress or a tensile stress. The magnitude of the intrinsic stress in the metal nitride layer 18 may vary depending on the particular application. For purposes of disclosing the subject matter herein, and by way of example only, further reference will be made to the illustrative example where the metal nitride layer 18 is a layer of titanium nitride, although the present inventions are not to be considered as limited to this particular example. More specifically, in the illustrative example where the metal nitride layer 18 is the layer of titanium nitride (described in the paragraph immediately above), the layer of titanium nitride exhibited a compressive intrinsic stress. In two illustrative examples, the magnitude of the compressive intrinsic stress in the illustrative layer of titanium nitride (described in the paragraph immediately above) was about 1500 MPa in one case (when the TiN layer was formed above a layer of dense oxide, e.g., a TEOS-based CVD silicon dioxide, with a thickness of about 350 nm) and about 2500 MPa in another case (when the TiN layer was formed above a thermally grown layer of silicon dioxide (a thermal oxide) having a thickness of about 100 nm). As will be understood by those skilled in the art, such a thermal oxide layer would be a more dense material as compared to the aforementioned TEOS-based CVD silicon dioxide material.

Figure 2:
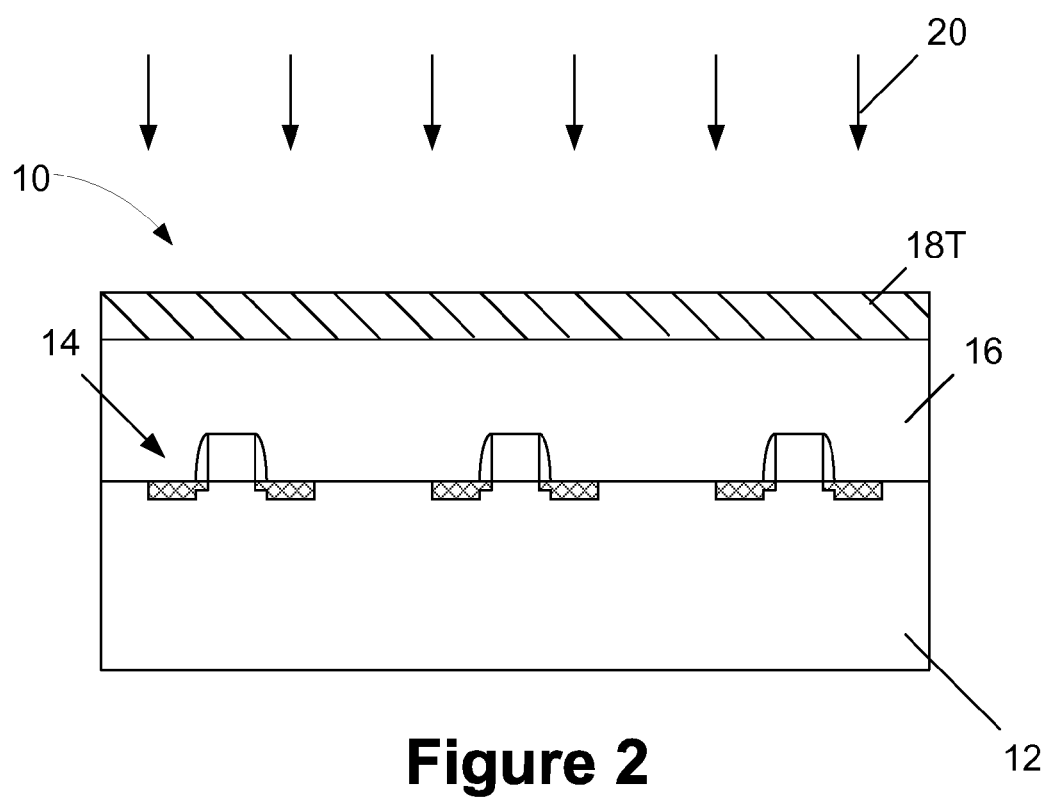
FIG. 2 is a schematic depiction of the metal nitride layer shown in FIG. 1 being subjected to one of the stress reduction processes described herein.

Next, as shown in FIG. 2, a schematically depicted stress-reduction process 20 was performed on the as-deposited illustrative layer of titanium nitride to reduce its intrinsic stress level and thereby define a treated metal nitride layer 18T having a stress level that is a lesser magnitude than the intrinsic stress level of the originally deposited metal nitride layer 18, a reduced stress level as compared to the intrinsic stress level in the originally formed layer of titanium nitride. The absolute amount or percentage by which the original intrinsic stress level of the metal nitride layer 18 is reduced may vary depending upon the particular application and depending upon a variety of factors, e.g., the magnitude of the intrinsic stress of the metal nitride layer 18 as originally formed, the thickness of the metal nitride layer 18, the nature and characteristics of any underlying material layer, etc. As disclosed herein, the stress reduction process 20 performed on the metal nitride layer 18 to reduce the intrinsic stress level of the metal nitride layer 18 may involve performing an anneal process, under certain conditions and in certain ambient atmospheres, or it may involve performing a plasma treatment process.

In one illustrative embodiment, the stress reduction process 20 may involve performing an anneal process at a temperature that ranges from about 250-350° C. for a duration of about 30 seconds-20 minutes in an ambient comprised of hydrogen ($H_2$), a commercially available forming gas (e.g., $N_2/H_2$ (97%/3% or 95%/5% relative concentrations), ammonium ($NH_3$), etc. In one illustrative embodiment, the stress reduction process 20 was a forming gas anneal (the "FG Anneal") process that involved performing an anneal process at a temperature of about 250° C. for a duration of about 20 minutes in an ambient comprised of a commercially available forming gas (e.g., $N_2/H_2$ (97%/3% or 95%/5% relative concentrations). It is believed that the duration of the FG Anneal process may be reduced to about 10 minutes or so while still achieving at least some of the benefits described herein. In another illustrative embodiment, the stress reduction process 20 was a hydrogen gas anneal (the "$H_2$ Anneal") process that involved performing an anneal process at a temperature of about 300° C. for a duration of about 30 seconds in an ambient comprised of hydrogen.

In yet another illustrative embodiment, the stress reduction process 20 is an ammonium-based remote plasma process (the "$NH_3$ Plasma") process that was performed on the illustrative layer of titanium nitride described above. The techniques and equipment used in performing such remote plasma processes are well known to those skilled in the art. In general, in a remote plasma process, a plasma is created at a location remote from the substrate 12, and the plasma cracks the process gas, e.g., ammonium, into radicals, such as $NH_2^+$ or hydrogen radicals, which were thereafter directed toward the layer of titanium nitride via a showerhead (not shown). The gas radicals exhibit an increased treatment effect on the layer of titanium nitride. In one illustrative embodiment, the remote plasma process was performed at a temperature of about 350° C. for a duration of about 30 seconds and a plasma power below about 700 W.

The various stress reduction processes 20 described above were performed on the illustrative titanium nitride layer having a thickness of about 20 nm that was formed by performing a PVD process at a temperature of 300° C. In one illustrative embodiment, the various stress reduction processes 20 may be performed ex situ, i.e., in a process chamber other than the process chamber used in initially forming the original metal nitride layer 18. In Case 1, the illustrative layer of titanium nitride was formed above a relatively low density oxide material, e.g., a TEOS-based layer of silicon dioxide, with a thickness of about 350 nm that was formed by a CVD process. In Case 2, the illustrative layer of titanium nitride was formed above a thermally grown layer of silicon dioxide with a thickness of about 100 nm that was formed by a furnace process, that had a density greater than the aforementioned TEOS-based CVD silicon dioxide material. As deposited, the illustrative layer of titanium nitride had an "as-deposited" compressive stress level. The illustrative layers of titanium nitride were then subjected to each of the aforementioned stress reduction processes 20 and the stress levels for the treated layers of titanium nitride were then determined using an ellipsometric method to explore the effectiveness of each of the stress reduction processes in reducing the intrinsic compressive stress of the as-deposited layers of titanium nitride. The resulting data (in approximate stress levels) is reflected in Table 1 below.

| Condition of TiN Layer | Case 1 Compressive Stress (MPa) | Case 2 Compressive Stress (MPa) |
|---|---|---|
| As Deposited | −1400 | −2500 |
| After FG Anneal Process | −500 | −3500 |
| After H$_2$ Anneal Process | −1200 | −3200 |
| After NH$_3$ Plasma Process | −1000 | −3300 |

Figure 3A:
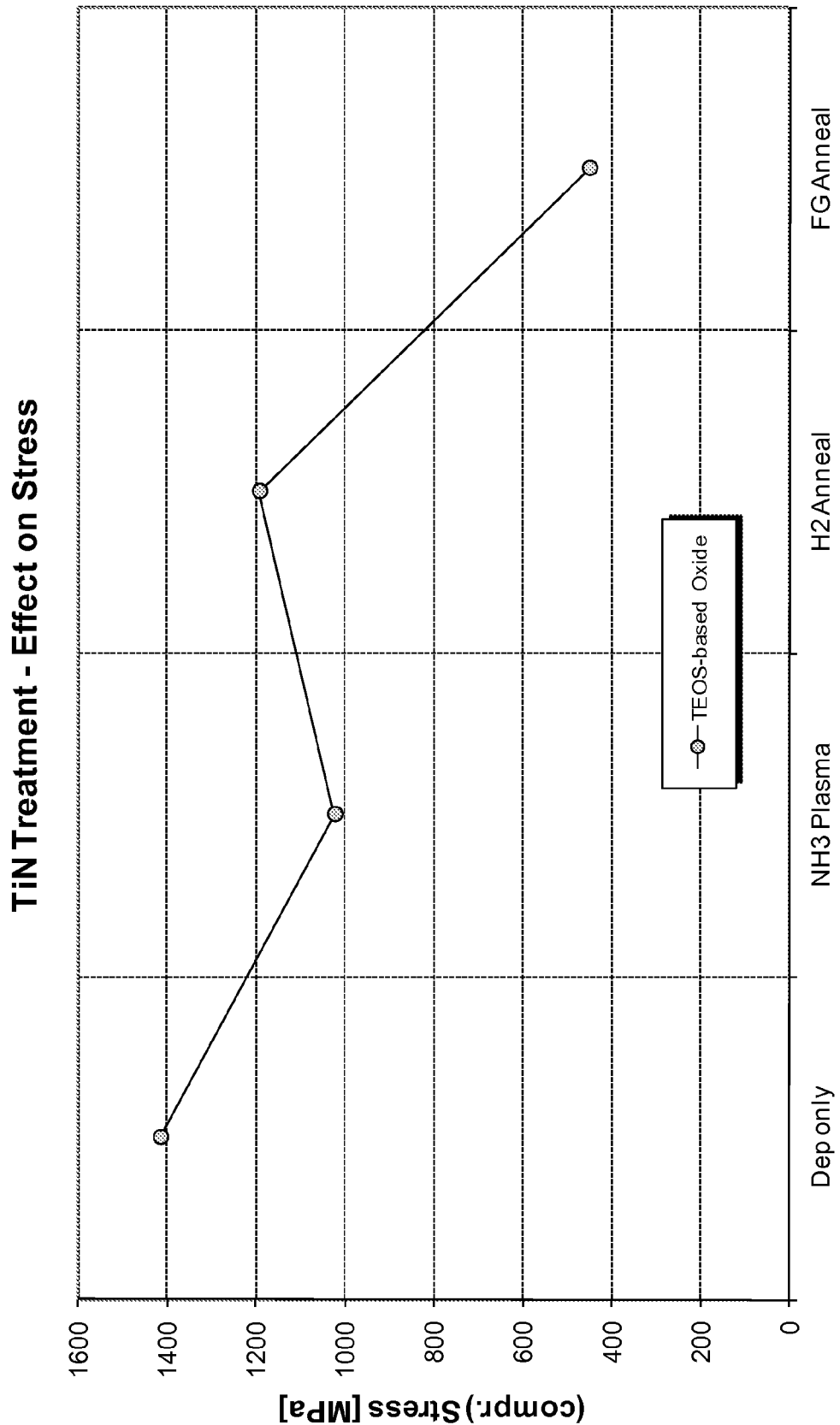
FIGS. 3A-3B are graphic depictions of the stress reduction levels achieved for one illustrative application using the methods disclosed herein.
Figure 3B:
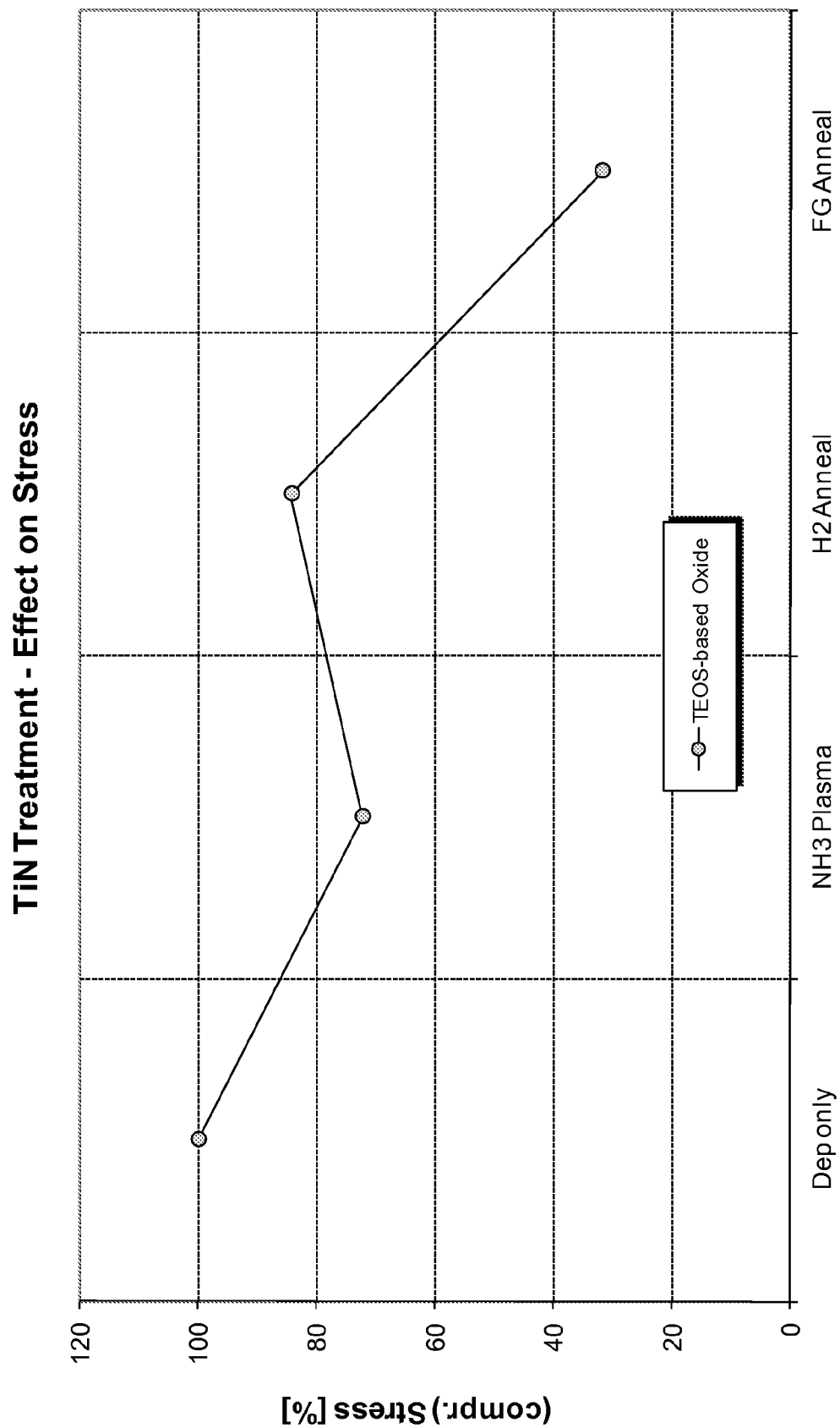

The above stress levels are depicted graphically in FIGS. 3A (absolute stress values) and 3B (relative stress values expressed as a percentage). As can be seen from this data, for the Case 1 condition, where the layers of titanium nitride were formed above the relatively lower density TEOS-based CVD silicon dioxide material (e.g., about 2.20 g/cm$^3$), the FG Anneal process was the most effective in reducing the intrinsic stress level of the illustrative layer of titanium nitride, followed by the NH$_3$ Plasma process and then the H$_2$ Anneal process. In terms of percentage reduction of the original intrinsic, as-deposited stress level of the illustrative layer of titanium nitride, the FG Anneal process, the NH$_3$ Plasma process and the H$_2$ Anneal process achieved reductions of about 66%, 33% and 20%, respectively. In terms of the magnitude of the stress reduction, the FG Anneal process, the NH$_3$ Plasma process and the H$_2$ Anneal process reduced the original intrinsic, as-deposited stress level of the illustrative layer of titanium nitride by about 1000 MPa, 500 MPa and 300 MPa, respectively. As to the Case 2 condition, where the layers of titanium nitride were formed above the relatively higher density thermal oxide material (e.g., about 2.27 g/cm$^3$) (as compared to the TEOS-based CVD silicon dioxide material), performing each of the FG Anneal process, the H$_2$ Anneal and the NH$_3$ Plasma process increased the compressive stress of the illustrative layers of titanium nitride. Thus, the data suggest that the aforementioned treatment of the layers of titanium nitride were more effective when the titanium nitride was formed above relatively lower density material, at least insulating materials that have a lower density than that of a TEOS-based layer of silicon dioxide that is formed by a CVD process, e.g., a layer of insulating material having a density less than about 2.20 g/cm$^3$. Thus, the present invention would seem to have wide applicability to formation of titanium nitride layers in integrated circuit products using ultra-low-k material, low-k insulating materials and insulating materials that, in general, have a density that is less than that of a TEOS-based layer of silicon dioxide that was formed by a CVD process, as described above.

Figure 4:
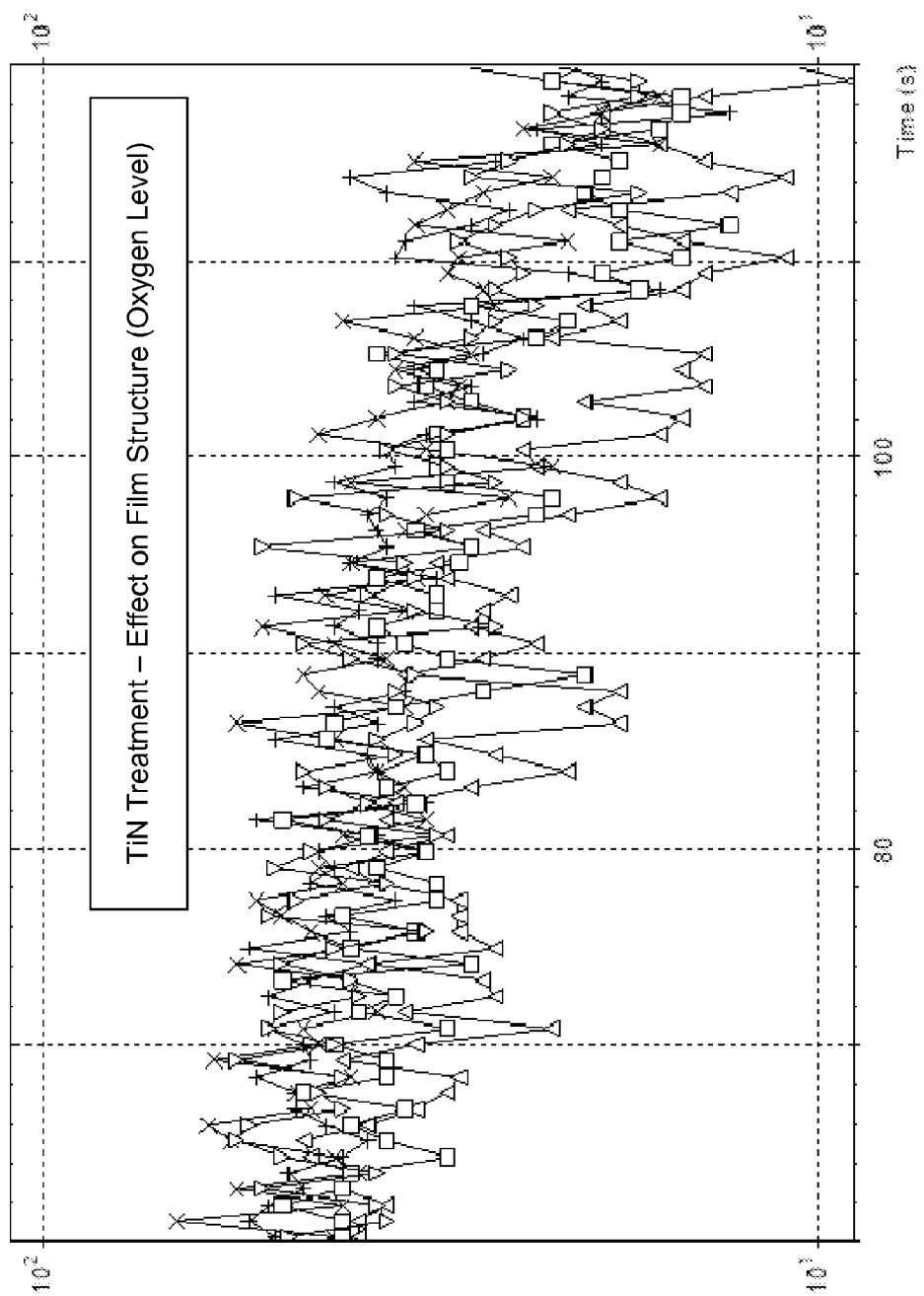
FIG. 4 is a graphic depiction of oxygen levels in an untreated layer of titanium nitride and layers of titanium nitride subjected to the novel methods disclosed herein.

To confirm that the stress reduction processes 20 did not adversely affect the structure of the illustrative layer of titanium nitride, the oxygen levels in an untreated (as-deposited) layer of titanium nitride and the treated layers of titanium nitride were determined using a mass spectroscopy based analytical tool (TOF-SIMS). This tool determines the oxygen content as the untreated and treated layers of titanium nitride were re-sputtered from above the layer of insulating material. The results of this analysis (see FIG. 4) confirmed that the oxygen concentration level for the untreated (as-deposited) layer of titanium nitride and the treated layers of titanium nitride were about the same, thereby indicating that the stress reduction processes 20 did not alter the structure of the layer of titanium nitride in any significant way.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a layer of insulating material above a semiconducting substrate;
   performing a physical vapor deposition process to form a metal nitride layer above and in contact with said layer of insulating material, said metal nitride layer having an intrinsic as-deposited stress level; and
   performing at least one process operation on said metal nitride layer in a processing ambient comprised of a forming gas to reduce a magnitude of said intrinsic as-deposited stress level in said metal nitride layer, wherein said forming gas is comprised of nitrogen and hydrogen.

2. The method of claim 1, wherein said intrinsic as-deposited stress level of said metal nitride layer is a compressive stress.

3. The method of claim 1, wherein said intrinsic as-deposited stress level of said metal nitride layer is a tensile stress.

4. The method of claim 1, wherein said metal nitride layer is one of the following: titanium nitride, tantalum nitride, niobium nitride, tungsten nitride, vanadium nitride, zirconium nitride, hafnium nitride, yttrium nitride or molybdenum nitride.

5. The method of claim 1, wherein said layer of insulating material is one of a TEOS-based layer of silicon dioxide that is formed by performing a CVD process, an ultra-low-k insulating material or a low-k insulating material.

6. The method of claim 1, wherein a relative concentration of nitrogen and hydrogen in said forming gas is included within the range of 97%/3%-95%/5%, respectively.

7. The method claim 1, wherein performing said at least one process operation on said metal nitride layer comprises performing an anneal process at a temperature of approximately 250-350° C. for a duration of approximately 30 seconds-20 minutes.

8. The method of claim 7, wherein performing said anneal process on said metal nitride layer in the presence of said forming gas reduces a magnitude of said intrinsic as-deposited stress level in said metal nitride layer by at least 66%.

9. The method of claim 1, wherein performing said at least one process operation on said metal nitride layer reduces a magnitude of said intrinsic as-deposited stress level in said metal nitride layer by at least 20%.

10. The method of claim 1, wherein said layer of insulating material has a density that is less than about 2.20 g/cm3.

11. A method, comprising:
    forming a layer of insulating material above a semiconducting substrate;
    performing a physical vapor deposition process to form a layer of titanium nitride above said layer of insulating material, said layer of titanium nitride having an intrinsic as-deposited stress level; and performing a remote plasma process on said layer of titanium nitride in a processing ambient comprised of ammonia to reduce a magnitude of said intrinsic as-deposited stress level in said layer of titanium nitride.

12. The method of claim 11, wherein said layer of insulating material is a TEOS-based layer of silicon dioxide that is formed by performing a CVD process.

13. The method of claim 11, wherein said remote plasma process is performed at a temperature of at least about 350° C. for a duration of at least 30 seconds.

14. The method of claim 11, wherein performing said remote plasma process on said layer of titanium nitride reduces a magnitude of said intrinsic as-deposited stress level in said layer of titanium nitride by at least 20%.

15. The method of claim 11, wherein performing said remote plasma process on said layer of titanium nitride reduces a magnitude of said intrinsic as-deposited stress level in said layer of titanium nitride by at least 33%.

16. The method of claim 11, wherein said layer of insulating material has a density that is less than about 2.20 g/cm3.

17. A method, comprising:
performing a chemical vapor deposition process to form a TEOS-based layer of silicon dioxide above a semiconducting substrate;
performing a physical vapor deposition process to form a layer of titanium nitride above and in contact with said TEOS-based layer of silicon dioxide, said layer of titanium nitride having an intrinsic as-deposited stress level; and
performing an anneal process on said layer of titanium nitride in a processing ambient comprised of a forming gas to reduce a magnitude of said intrinsic as-deposited stress level in said layer of titanium nitride, wherein said forming gas is comprised of nitrogen and hydrogen.

18. The method of claim 17, wherein a relative concentration of nitrogen and hydrogen in said forming gas is included within the range of 97%/3%-95%/5%, respectively.

19. The method of claim 17, wherein performing said anneal process on said layer of titanium nitride in the presence of said forming gas reduces a magnitude of said intrinsic as-deposited stress level in said layer of titanium nitride by at least 66%.

20. The method of claim 17, wherein performing said anneal process on said layer of titanium nitride reduces a magnitude of said intrinsic as-deposited stress level in said layer of titanium nitride by at least 20%.

21. The method of claim 17, wherein said anneal process is performed at a temperature of approximately 250-350° C. for a duration of approximately 30 seconds-20 minutes.

22. The method of claim 21, wherein said anneal process is performed for a duration of about 20 minutes.

23. The method of claim 17, wherein performing said anneal process on said layer of titanium nitride in the presence of said forming gas reduces a magnitude of said intrinsic as-deposited stress level in said layer of titanium nitride by at least 66%.

24. A method, comprising:
forming a layer of insulating material above a semiconducting substrate;
performing a physical vapor deposition process to form a metal nitride layer above said layer of insulating material, said metal nitride layer having an intrinsic as-deposited stress level; and
performing a remote plasma process on said metal nitride layer in a processing ambient comprised of ammonia to reduce a magnitude of said intrinsic as-deposited stress level in said metal nitride layer.

25. The method of claim 24, wherein said metal nitride layer comprises one of titanium nitride, tantalum nitride, niobium nitride, tungsten nitride, vanadium nitride, zirconium nitride, hafnium nitride, yttrium nitride and molybdenum nitride.

26. The method of claim 24, wherein said layer of insulating material has a density that is less than about 2.20 g/cm3.

27. The method of claim 24, wherein said remote plasma process is performed at a temperature of at least about 350° C. for a duration of at least 30 seconds.

28. The method of claim 24, wherein performing said remote plasma process on said metal nitride layer reduces a magnitude of said intrinsic as-deposited stress level in said metal nitride layer by at least 33%.

* * * * *